United States Patent [19]

Slavin

[11] Patent Number: 4,622,440

[45] Date of Patent: Nov. 11, 1986

[54] DIFFERENTIAL HEARING AID WITH PROGRAMMABLE FREQUENCY RESPONSE

[75] Inventor: Martin J. Slavin, Dix Hills, N.Y.

[73] Assignee: In Tech Systems Corp., Hauppauge, N.Y.

[21] Appl. No.: 599,137

[22] Filed: Apr. 11, 1984

[51] Int. Cl.⁴ ........................ H04R 25/00; H04R 3/04; H03G 3/20

[52] U.S. Cl. ........................ 381/68.1; 381/68; 381/110; 381/68.2

[58] Field of Search ........ 179/107 FD, 107 K, 107 E, 179/182 K; 181/129, 130; 381/58, 60, 68, 92, 110

[56] References Cited

U.S. PATENT DOCUMENTS

| | | | |
|---|---|---|---|
| Re. 27,487 | 9/1972 | Hassler | 179/121 D |
| 2,783,312 | 2/1957 | Mouzon | 179/107 |
| 3,573,399 | 4/1971 | Schroeder et al. | 179/121 D |
| 3,763,333 | 10/1973 | Lichowsky | 179/107 R |
| 3,836,732 | 9/1974 | Johanson et al. | 179/107 FD |
| 3,875,349 | 4/1975 | Ruegg | 179/107 FD |
| 3,894,195 | 7/1975 | Kryter | 179/107 FD |
| 3,928,733 | 12/1975 | Hueber | 179/107 R |
| 3,975,599 | 8/1976 | Johanson | 179/107 FD |
| 3,989,904 | 11/1976 | Rohrer et al. | 179/107 FD |
| 3,995,124 | 11/1976 | Gabr | 179/139 |
| 4,051,330 | 9/1977 | Cole | 179/107 FD |
| 4,051,331 | 9/1977 | Strong et al. | 179/107 R |
| 4,118,604 | 10/1978 | Yanick | 179/107 FD |
| 4,187,413 | 2/1980 | Moser | 179/107 FD |
| 4,276,781 | 7/1981 | Leitner | 73/647 |
| 4,366,349 | 12/1982 | Adelman | 179/107 FD |
| 4,400,590 | 8/1983 | Michelson | 179/107 FD |
| 4,453,264 | 6/1984 | Hochstein | 381/110 |
| 4,471,171 | 9/1984 | Köpke et al. | 381/68 |

FOREIGN PATENT DOCUMENTS

| | | | |
|---|---|---|---|
| 0064042 | 11/1982 | European Pat. Off. | 179/107 R |
| 0071845 | 2/1983 | European Pat. Off. | 179/107 R |
| 3205685 | 8/1983 | Fed. Rep. of Germany | 179/107 R |
| 57-42296 | 3/1982 | Japan | 179/107 R |
| 57-44396 | 3/1982 | Japan | 381/92 |
| 57-57100 | 4/1982 | Japan | 179/107 R |
| 723221 | 2/1955 | United Kingdom | 179/107 R |
| 2057228 | 3/1981 | United Kingdom | |

OTHER PUBLICATIONS

"Voice Operated Control Switch", *elektor,* Dec. 1979, vol. 5, pp. 12-40-12-41.

"Active Filking-A Step Toward the Programmable Hearing Aid", *Hearing Instruments,* vol. 33, No. 10, Oct. 1982, p. 20.

"Method and Apparatus for Adapting the Transfer Function in a Hearing Aid" PCT application WO83/02212, pub. Jun. 1983, Bisgaard et al.

Hosticka and Brodersen, MOS Sampled Data Recursive Filters Using Switched Capacitor Integrators, vol. SC-12, No. 6, pp. 600-608 (Dec. 1977).

Material Semiconductor Handbook, MF10 Monolithic Dual Switched Capacitor Filter, pp. 9-121-9-222.

*Primary Examiner*—Gene Z. Rubinson
*Assistant Examiner*—Danita R. Byrd
*Attorney, Agent, or Firm*—Blum Kaplan Friedman Silberman & Beran

[57] ABSTRACT

A differential input hearing aid with a programmable frequency response provides the hard of hearing with the capability to listen to individual conversations in the midst of high ambient background noise, and to have the frequency response of the hearing aid tailored to the individual user by programming the desired response characteristics into the hearing aid by digital signals. The audio inputs of two microphones are applied to a subtractive circuit with the balance of the inputs being controllable. Digitally controlled band pass filters with selectable band and selectable level of amplification are provided.

27 Claims, 3 Drawing Figures

DIFFERENTIAL HEARING AID WITH PROGRAMMABLE FREQUENCY RESPONSE

BACKGROUND OF THE INVENTION

This invention relates generally to a hearing aid and especially to a hearing aid employing differential audio inputs combined with a programmable filtered frequency response. While the art of hearing aids is generally well known and well understood, hearing aid users continue to suffer from the non-discriminating nature of hearing aids, resulting in the equal amplification of both audio information and background noise. Additionally, it is well known in the medical arts relating to human audio function, that most hearing loss does not take place equally across the audio frequency spectrum, but rather is localized at certain frequencies and to certain levels.

While hearing aids have taken various forms in an attempt to both cancel background noise and to more accurately customize the frequency response of the hearing aid to its particular user, these attempts have resulted in hearing aids that require constant adjustment by their owners as well as extended and elaborate set-up procedures.

Accordingly, it is desirable to provide a hearing aid having differential audio inputs coupled with a programmable frequency response to provide the hard of hearing with the capability to listen to individual conversations in the midst of high ambient background noise, and to have the frequency response of the hearing aid tailored to the individual user in an expedited and low cost manner.

SUMMARY OF THE INVENTION

Generally speaking, in accordance with the present invention, an improved hearing aid having differential audio inputs and a programmable frequency response is provided. The hearing aid includes two small microphones which are used to pick-up the sound; the first microphone is placed at the front of the unit and the second microphone is placed at the rear of the unit. The output of these two microphones are coupled to a differential amplifier. The differential amplifier amplifies only the difference signal, which is a subtraction of the signal of the first microphone from the signal of the second microphone, and is adjustable by a balance control to permit selected deactivation of the subtraction feature. A telephone pick-up input and an auxiliary signal input is provided to enable the user to have access to a wide variety of signal sources. The output of the differential amplifier is coupled to a voice activated switch (VOX), which is sensitive to signal level changes, and which is used to control power to the later amplifier portions of the unit, thereby helping to conserve the hearing aid battery source.

The output of the VOX is coupled to an array of switched capacitor filter circuits. These circuits provide the required controlled frequency response based on pre-programmed digital information which is stored within the hearing aid in an electrically programmable read only memory (EPROM). The information may be stored in the EPROM through an input jack or the EPROM can be a plug-in unit. The switched capacitor filter circuits permit the breakdown of the applied audio signal by digital processing into a series of frequency bands of selected width and center frequency as determined by the digital information stored in the EPROM. The selective amplification of the bands as required to deal with the hearing deficiency of the wearer is also set by the information stored in the EPROM. The output of the amplified bands are joined into a corrected audio signal.

The joined, amplified outputs of the switched capacitor filter circuits are then coupled into an amplifier circuit having a built-in squelch means, so as to allow the user to set the threshold of the signal that will be passed through the hearing aid. The output of the squelching amplifier is then coupled through a final signal amplifier having a means for adjusting the overall volume, and the output of the final amplifier is further coupled to drive an earphone.

Accordingly, it is an object of the invention to provide an improved hearing aid.

Another object of the invention is to provide an improved hearing aid having differential audio inputs to enable the selective cancelling of background noise.

A further object of the invention is to provide an improved hearing aid having a digital programmable frequency response which can be set through the use of plug in EPROMS.

Still another object of the invention is to provide an improved hearing aid which is readily adapted to the user.

Still other objects and advantages of the invention will in part be obvious and will in part be apparent in the specification.

The invention accordingly comprises the features of construction, combination of elements and arrangements of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
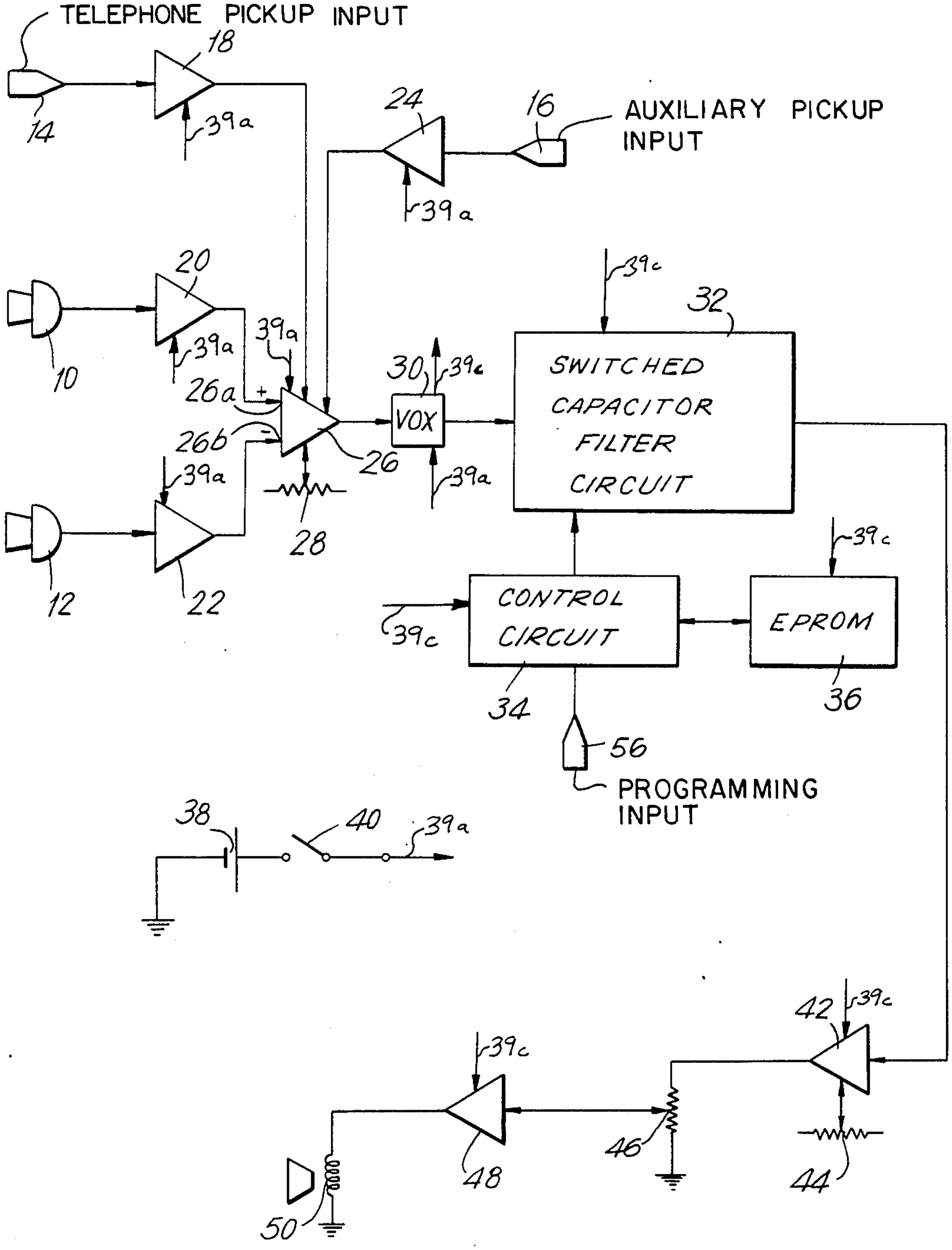
FIG. 1 is a block diagramatic circuit diagram of the instant invention.

Referring now to FIG. 1, a block circuit diagram of the apparatus of the present invention is shown, wherein, a front microphone 10 is connected through an input buffer 20 to the positive input *26a* of differential input amplifier 26. A rear microphone 12 is connected through a buffer 22 to the negative input *26b* of differential input amplifier 26. The front microphone 10 and rear microphone 12 are connected to differential amplifier 26 in a subtractive manner, so that any sound which appears at both the front microphone 10 and the rear microphone 12 with equal amplitude will, ideally, be cancelled out. This arrangement provides the hearing aid with a background noise cancelling function, since most background noise will originate at a point of sufficient distance from the listener such that it will arrive at both the front microphone 10 and rear microphone 12 at substantially the same time.

Differential balance control 28 is provided coupled to differential amplifier 26 in order to adjust the ratio of the subtraction circuit between the front microphone 10 and the rear microphone 12. This permits balance for maximizing subtraction, although full elimination of all noise is difficult if not impossible. In addition, it permits creating an imbalance or even eliminating the input of one microphone so that background noise is selectively received by the user. Where the user wishes to pick up close conversations, such as conversations at a table in a noisy restaurant, maximum subtraction would be selected by adjusting balance control 28. Where the user is walking in the street, minimum subtraction might be selected since it would be desirable to pick up distant noises such as vehicle horns or traffic noise. In a restaurant, such background noise could override and block out close conversation in the absence of the subtraction feature in accordance with the invention.

The differential amplifier 26 is also provided with a telephone pick-up input 14 which is buffered through input buffer 18 and an auxiliary pick-up input 16 which is buffered through input buffer 24. The output of the differential amplifier 26 is then coupled to a voice operated switch (VOX) 30. VOX 30 is set to detect minimum input threshold levels, and is used to control power to the electronic components of the hearing aid, thereby saving battery power when the unit is not in use, and when there are no sounds to be amplified. Thus, the power from battery 38 and switch 40, as indicated by arrow 39*a*, is applied to power buffers 18, 20, 22 and 24, differential amplifier 26 and VOX 30 as shown by arrows 39*a*. When VOX 30 is actuated by a minimum input threshold level from differential amplifier 26, power is applied from VOX 30, as indicated by arrow 39*c*, to circuit elements 32, 34, 36, 42 and 48 as indicated by arrows 39*c*.

The output of VOX 30 is an analog signal which is then coupled to a switched capacitor filter circuit 32. The switched capacitor filter circuit 32 permits digitally controlled processing of analog audio signals. Circuit 32 may include a single integrated hybrid MOS device, such as the National Semiconductor MF 10 universal monolithic dual switched capacitor filter made of operational amplifiers, capacitors and MOS switches. The device uses ratioed capacitors formed in a common integrated circuit substrate, the MOS switch applying the input signal to a first capacitor and then connecting the first capacitor to a second capacitor while disconnecting the input to the first. The result is controlled charging of the second capacitor by a selected frequency band present in the input. A group of band pass filters will be provided covering the desired audio range with the band of each filter being digitally adjustable. The output of each band pass filter is applied to a digitally adjustable amplifier which serves to separately amplify each selected band in accordance with the needs of the user. The outputs of the respective amplified frequency bands are combined at the output to circuit 32 to produce a corrected audio signal.

The switched capacitor filter circuit 32 operates under the command of a microprocessor control circuit 34 by numerically imposing the desired frequency response transfer function (selection of the bands and of degree of amplification of each band) on the input signal received from the VOX 30. The microprocessor control circuit 34, receives its instructions from an electrically programmed read only memory (EPROM) 36. In standard operation, an individual with a hearing problem would have his hearing tested with a computerized audiometer. The audiometer would measure hearing loss within the parameters of center frequency or frequencies of hearing loss, band width of frequency of hearing loss about each center frequency and percentage of hearing loss at each center frequency. The computerized audiometer would transform this information into numeric values representative of center frequency, band width and amplification for each band. These numeric values would then be digitally programmed, by the computerized audiometer, into a form suitable for storage in an EPROM and for setting switched capacitor filter circuit 32. Two approaches are available for programming EPROM 36 to the correction needs of the user. In the first, an input jack 56 would be provided coupled to EPROM 36 through microprocessor 34 for applying the programming signal to the EPROM 36 from an output of the computerized audiometer. In the second approach, the EPROM 36 is adapted to be unplugged from the hearing aid circuit and plugged into a computerized audiometer for programming. The programmed EPROM would then be unplugged from the computerized audiometer and inserted into the programmable hearing aid.

By the foregoing arrangement, a defect in the hearing of the user would be correctable with precision. The precise frequency bands requiring correction would be identified by the audiometer and the degree of correction in each such band width would likewise be identified. The correction in terms of bandwidth and center frequency of each band and amplification thereof is stored in EPROM 36 to provide a hearing aid programmed to the needs of the user.

Figure 3:
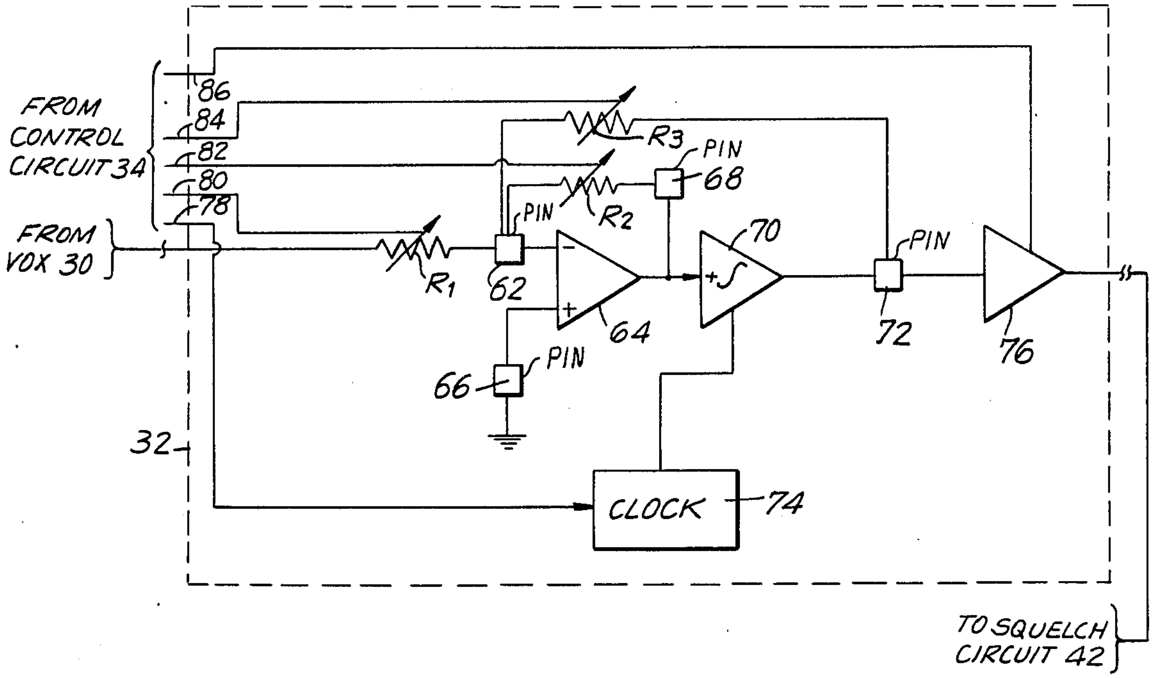
FIG. 3 is an in part block, in part circuit diagram of an embodiment of a switched capacitor filter usable in the hearing aid constructed in accordance with the invention.

Referring to FIG. 3, an in part block, in part circuit diagram of a switched capacitor filter circuit 32 incorporating the switched capacitor filter of the National Semiconductor MF 10 is depicted. The input from VOX 30 is applied through variable resistor $R_1$ to chip pin input 62, to provide one input to an operational amplifier 64. The other input to operational amplifier 64 is through chip pin input 66 which is connected to ground. A second variable resistor $R_2$ is connected between chip pin input 62 and 68 across operational amplifier 64. The output of operational amplifier 64 is applied to the input of integrator 70, the output of which is connected to chip output pin 72. A third variable resistor $R_3$ is connected between chip pins 62 and 72. A variable clock circuit 74 is connected to integrator 70. The output to the National Semiconductor switched capicitor filter, at chip pin 72, is applied to a controlled operational amplifier 76, the output of which is applied to squelch circuit 42.

In order to control the center frequency and bandwidth of switched capacitor filter circuit 32, the frequency of clock 74 and the values of resistors $R_1$, $R_2$ and $R_3$ are digitally set by control circuit 34 along lines 78, 80, 82 and 84, as by MOS gates. Similarly, the degree of amplification of the passed band is controlled by control circuit 34 through line 86 coupled to operational amplifier 76.

In the case of the National Semiconductor device, the center frequency of the output, $f_o$, is equal to the clock frequency divided by 50 or 100, depending on the setting of the inputs to the circuit chip. The bandpass gain at $f_o$ is equal to $-R_3/R_1$. The quality factor of the output, Q, equals $f_o/BW$, which equals $R_3/R_2$. The bandwidth BW equals −3 dB bandwidth of the bandpass output.

By using switched capacitor filters a relatively low cost filter arrangement, requiring a minimal number of external components is provided which permits digital programming. Such filters are highly accurate since filter cut-off and frequency stability is directly dependent upon the external clock stability.

Referring again to FIG. 1, the output of the switched capacitor filter circuit 32 is then coupled through a squelch circuit 42. Squelch circuit 42 is adjusted through the use of a squelch control 44 to allow the user to set the threshold of the signal that will be listened to by the user. The output of the squelch circuit 42 is then coupled through the master volume control 46, through the output amplifier 48 and to the earphone 59.

Figure 2:
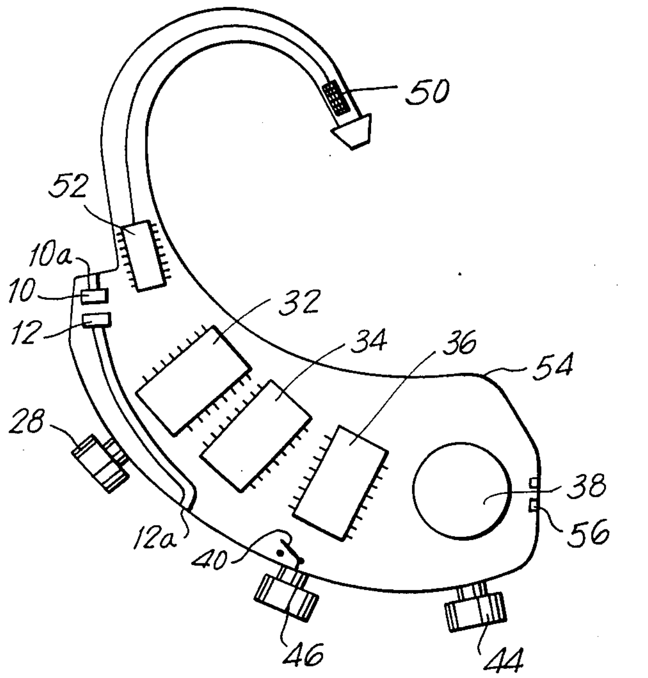
FIG. 2 is a diagramatic sectional view taken along the longitudinal center line through a hearing aid constructed in accordance with the present invention.

Referring now to FIG. 2, a longitudinal diagramatic section view of the present invention can be seen, wherein the differential balance control 28, squelch control 44, and master volume control 46 are mounted within the hearing aid case 54 so that they are still accessible when the hearing aid case 54 is closed. Master power switch 40 is coupled to master volume control 46. The battery 38 is mounted within the hearing aid case 54, as is the switched capacitor filter circuit 32, microprocessor control circuit 34, and EPROM 36. EPROM 36 may be a plug-in unit. An amplifier circuit package 52 which contains a plurality of operational amplifiers used in the present invention for amplifying and buffering the audio signal, is also mounted within the hearing aid case 54. Front microphone 10 and rear microphone 12 are positioned within the hearing aid case 54 so that front microphone 10 has access to sound through the front microphone sound port 10*a*, and rear microphone 12 has access to sound through the rear microphone sound port 12*a*. Sound ports 10*a* and 12*a* may be oriented to face in different directions preferably more than 90 degrees apart. Earphone 50 is mounted within the hearing aid case 54 so that it will fit within the human ear canal when the hearing aid case is placed behind the ear. While the embodiment depicted has several external controls, if desired, only a volume control can be provided, the other controls being programmed by means of control circuit 34 and EPROM 36, or pre-set by a manual internal adjustment.

It is clear from the foregoing that a differential audio input hearing aid with a programmable frequency response can be constructed according to the invention, allowing an individual with a hearing loss to be provided with a low cost and personally calibrated hearing aid.

It will thus be seen that the objects set forth above, and those made apparent from the preceeding description, are effectively attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all the generic and specific features of the invention herein described and statements of the scope of the invention which, as a matter of language, might be said to fall therebetween.

What is claimed is:

1. A hearing aid comprising a first microphone having an input oriented in a first direction; a second microphone having an input oriented in a second direction different from said first direction; subtractive circuit means for receiving the audio outputs of said first and second microphones and subtracting one of said audio signals from the other to produce a net audio signal, balance control means for electrically adjusting the input ratio of the audio signals from said first microphone and said second microphone, and an electro-acoustic transducer positioned to apply an acoustic signal to the user of the hearing aid in response to said net audio signal.

2. The hearing aid of claim 1, said first and second directions are more than 90 degrees apart.

3. The hearing aid of claim 2, wherein said subtractive circuit means is a differential input operational amplifier.

4. The hearing aid of claim 1, including a telephone input means for permitting coupling of said hearing aid to a telephone.

5. The hearing aid of claim 1, including auxiliary input means for permitting coupling of said hearing aid to an auxiliary audio signal source.

6. The hearing aid of claim 1, including a voice-operated switch (VOX) means coupled intermediate at least one of said microphones and said electro-acoustic transducer for selectively actuating said hearing aid in response to audio inputs, whereby power consumption by the hearing aid is minimized.

7. The hearing aid of claim 1, wherein said balance control means is adapted to cut off at least part of that portion of the net audio signal represented by said second microphone, whereby sound from distant sources is passed by said subtractive circuit means.

8. A hearing aid comprising a first microphone having an input oriented in a first direction; a second microphone having an input oriented in a second direction different from said first direction; subtractive circuit means for receiving the audio outputs of said first and second microphones and subtracting one of said audio signals from the other to produce a net audio signal, and electro-acoustic transducer means positioned to apply an acoustic signal to the user of the hearing aid in response to said net audio signal, band pass filter means coupled intermediate said subtractive circuit means and said electro-acoustic transducer means for dividing said net audio signal into a plurality of frequency bands, means for amplifying each said band by a selected amount representative of the correction appropriate for the user of the hearing aid, means for selectively setting the center frequency and band width of at least one of said frequency bands, and means for joining the outputs of said amplifying means to a corrected audio signal.

9. The hearing aid of claim 8, and including digital means for selectively setting said center frequency and band width including an EPROM for storing the instructions for such setting.

10. The hearing aid of claim 9, including means for applying a programmable signal to said EPROM for the selective programming thereof.

11. The hearing aid of claim 9, wherein said EPROM is a plug-in unit for the substitution of an EPROM programmed for a particular user.

12. The hearing aid of claim 8, including digital means for setting the amplification level of each of said amplifying means including an EPROM for storing the instructions for such setting.

13. The hearing aid of claim 9, including digital means for setting the amplification level of each of said amplifying means, said EPROM storing instructions for control of such setting.

14. The hearing aid of claim 13, including means for applying a programmable signal to said EPROM for the selective programming thereof.

15. The hearing aid of claim 13, wherein said EPROM is a plug-in unit for the substitution of an EPROM programmed for a particular user.

16. The hearing aid of claim 8, wherein the band pass filter means comprises switched capacitor filter circuits.

17. A hearing aid comprising microphone means for receiving an audio signal; band pass filter means for dividing said audio signal into a plurality of frequency bands, means for amplifying each said band by a selected amount representative of the correction appropriate for the user of the hearing aid; means for selectively setting the center frequency of at least one of said frequency bands to one of a plurality of desired values representative of the correction appropriate for the user of the hearing aid, means for joining the outputs of said amplifying means to a corrected audio signal; and an electro-acoustic transducer positioned to apply an acoustic signal to the user of the hearing aid in response to said net audio signal.

18. The hearing aid of claim 17, including means for selectively setting the bandwidth of said at least one of said bands to one of a plurality of desired values representative of the correction appropriate for the user of the hearing aid.

19. The hearing aid of claim 18, including means for selectively setting the center frequency and bandwidth of a plurality of said frequency bands.

20. The hearing aid of claim 18, and including digital means for selectively setting said center frequency and band width including an EPROM for storing the instructions for such setting.

21. The hearing aid of claim 20, including means for applying a programmable signal to said EPROM for the selective programming thereof.

22. The hearing aid of claim 21, wherein said EPROM is a plug-in unit for the substitution of an EPROM programmed for a particular user.

23. The hearing aid of claim 17, including digital means for setting the amplification level of each of said amplifying means including an EPROM for storing the instructions for such setting.

24. The hearing aid of claim 23, including digital means for setting the amplification level of each of said amplifying means, said EPROM storing instructions for control of such setting.

25. The hearing aid of claim 24, including means for applying a programmable signal to said EPROM for the selective programming thereof.

26. The hearing aid of claim 23, wherein said EPROM is a plug-in unit for the substitution of an EPROM programmed for a particular user.

27. The hearing aid of claim 17, wherein the band pass filter means comprises switched capacitor filter circuits.

* * * * *